United States Patent
Brown

(10) Patent No.: US 6,647,538 B1
(45) Date of Patent: Nov. 11, 2003

(54) APPARATUS AND METHOD FOR SIGNAL SKEW CHARACTERIZATION UTILIZING CLOCK DIVISION

(75) Inventor: Jeff Brown, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 84 days.

(21) Appl. No.: 10/045,473

(22) Filed: Nov. 8, 2001

(51) Int. Cl.[7] .............................................. G06F 17/50
(52) U.S. Cl. .................................... 716/1; 716/4; 716/6
(58) Field of Search ............................ 716/1–6, 16–18; 714/700

(56) References Cited

U.S. PATENT DOCUMENTS

| | | | | |
|---|---|---|---|---|
| 5,333,154 A | * | 7/1994 | Hengeveld et al. | 375/354 |
| 6,069,508 A | * | 5/2000 | Takai | 327/161 |
| 6,173,432 B1 | * | 1/2001 | Harrison | 716/1 |
| 6,337,832 B1 | * | 1/2002 | Ooishi et al. | 365/233 |

* cited by examiner

Primary Examiner—Matthew Smith
Assistant Examiner—Paul Dinh
(74) Attorney, Agent, or Firm—Carstens, Yee & Cahoon, L.L.P.

(57) ABSTRACT

An on-chip apparatus and method for measuring signal skew between two on-chip signals are provided. The apparatus and method generate a pulse train which is at a first state during a time period between a clocking of a circuit component and a time at which the circuit component generates an output signal, and a second state between clockings of the circuit component. The pulse width of the pulses in the pulse train is representative of the skew, i.e. change of phases or timing, in the signal due to the presence of the component. The pulse train may further be pseudo-clock divided to generate more measurable pulses. The output from is produced using a single output pad. The apparatus and method produce a long measurable pulse width on a single output pad. A pulse width of 10 s of ns is achievable instead of 1–2 ns as in the known art. The pulse width measurement is done with a single tester channel instead of two as in the known art.

35 Claims, 2 Drawing Sheets

APPARATUS AND METHOD FOR SIGNAL SKEW CHARACTERIZATION UTILIZING CLOCK DIVISION

BACKGROUND OF THE INVENTION

1. Technical Field

The present invention is directed generally toward the measuring of signal skew between two on-chip signals to identify operational characteristics of circuit components. More specifically, the present invention is directed toward the characterization of signal skew using clock division.

2. Description of the Related Art

Measurement of signal skew is important in verifying simulation data to determine if computer simulations of circuit designs accurately reflect the resultant chip. Known methods of measuring signal skew between two on-chip signals involves measuring differences in pad to pad delays on a chip by stimulating a bypass path and a real path using a tester that is external to the chip. The difference between the signal sent along the bypass path and the signal sent along the real path represents a signal skew. The signal skew may be a measure, for example, of delay due to components along the real path.

The problems with this approach to determining signal skew are that an external tester must use two channels to perform the measurements of the signal skew, one for stimulation of the pad leading to the bypass path or the real path, and another channel to measure the received signals at the output pad. Each channel introduces a significant source of error in the measurement of the signal skew.

In addition, the components on the chip are typically able to handle signals at a much higher speed than the speed at which the external testers can drive signals onto the chip for testing. Thus, the external testers do not provide a completely accurate representation of the full capability of the chip. This leads to errors in verifying simulation data. Thus, it would be beneficial to have an apparatus and method for measuring signal skew that avoids the problems noted above with known methods.

SUMMARY OF THE INVENTION

The present invention provides an on-chip apparatus and method for measuring signal skew between two on-chip signals. The apparatus and method of the present invention generates a pulse train which is at a first state during a time period between a clocking of a circuit component and a time at which the circuit component generates an output signal, and a second state between clockings of the circuit component. The pulse width of the pulses in the pulse train is representative of the skew, i.e. change of phases or timing, in the signal due to the presence of the component. The pulse train may further be pseudo-clock divided to generate more measurable pulses. The output from the present invention is produced using a single output pad.

The apparatus and method produce a long measurable pulse width on a single output pad. With the present invention, a pulse width of 10 s of ns is achievable instead of 1–2 ns as in the known art. The pulse width measurement is done with a single tester channel instead of two as in the known art. The hard macro approach of the present invention minimizes any error from layout proximity and routing issues.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

The present invention provides an on-chip mechanism for measuring the skew between two on-chip signals in order to determine operational characteristics of circuit components. The preferred embodiments of the present invention will be described in terms of using the present invention to measure access time of a memory. However, the present invention is not limited to such an application and may be used to measure operational characteristics of other circuit components without departing from the spirit and scope of the present invention. For example, the present invention may be used to analyze any hard macro or delay through standard cells and may also be used to analyze routing level differences between paths that are otherwise similar.

Figure 1:
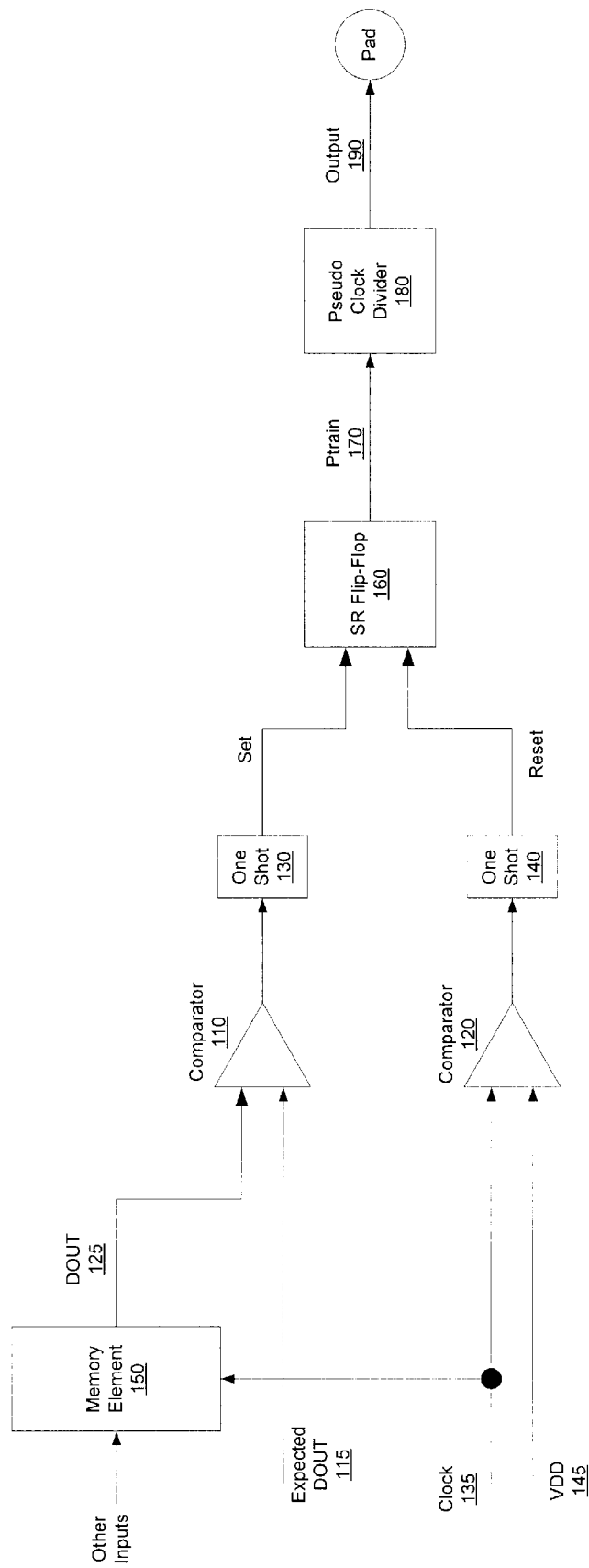
FIG. 1 is a circuit diagram of a circuit for characterizing signal skew in accordance with one exemplary embodiment of the present invention.

With reference now to the figures and in particular with reference to FIG. 1, a circuit diagram of an apparatus according to the present invention is shown. As shown in FIG. 1, the apparatus includes two comparators 110 and 120 that generate output signals to one shot circuits 130 and 140. The comparator 110 receives an expected data output signal 115 as one input, and a data output signal 125 from the memory element 150 as a second input. The comparator 120 receives a clock signal 135 as one input, and a voltage signal 145 as a second input.

The comparator 120 is used to determine when the memory element 150 is clocked. That is, by comparing the clock signal 135 to the voltage signal 145, the comparator generates an output signal to the one shot circuit 140 when the clock signal 135 is at a state to trigger the operation of the memory element 150. Stated another way, the comparator 120 is used to determine when the clock signal 135 goes high for the memory in comparison to the reference voltage VDD. The one shot circuit 140 then generates an output signal to the reset input of the SR flip-flop 160.

The comparator 110 is used to determine when a data output signal is sent out of the memory element 150. That is, by comparing the expected data output signal 115 to the data output signal 125, a determination is made as to when data is being output by the memory element 150. When a data output signal is detected by the comparator 110, the comparator 110 outputs a signal to the one shot circuit 130. Stated another way, the comparator 110 is used to compare the data output signal 125 from the memory element 150 with a reference data output signal 115 to determine when data is being output by the memory element 150. The one shot circuit 130 outputs a signal to the set input of the SR flip-flop 160.

The one shot circuits 130 and 140 trigger the set and reset inputs to the SR flip-flop 160. The SR flip-flop 160 outputs a pulse train. The changes in the pulse train, from high to low and vice versa, are the result of the switching of the SR flip-flop 160 based on the set and reset inputs. Thus, the outputs from the one shot circuits 130 and 140 cause the pulse train output by the SR flip-flop to change from high to low and low to high. The outputs from the one shot circuits 130 and 140 are, in turn, controlled by whether or not the clock signal goes high for the memory and whether data is output by the memory element 150.

The initial conditions of the circuit will cause the SR flip-flop 160 to have a high output. On a clock event, the on shot circuit 140 will trigger the reset input of the SR flip-flop 160 and its output will go low. At the same time as the clock signal 135 is sent to the comparator 120, the expected data output signal 115 is presented to the comparator 110. This expected data output signal 115 may be driven by an on-chip circuit or externally from a pad. When the actual memory data output signal 125 reaches the comparator 110, the comparator outputs a signal to the one shot circuit 130 which triggers the set input of the SR flip-flop 160. The output of the SR flip-flop 160 then goes high again. In a preferred embodiment, a series of nine transitions in the output from the SR flip-flop, each period between transitions representing a pulse, are used to generate the input pulse train 170 to the pseudo clock divider 180. Nine transitions are used with this exemplary embodiment in order to get a falling and rising edge on the output pulse after two levels of division, as described in greater detail hereafter. The pulses preferably have equal cycle times, i.e. the time between rising edges (or similar events in the pulse train).

The pseudo clock divider 180 takes the input pulse train and produces a measurable pulse output signal 190. For example, the pseudo clock divider 180 takes the nine low pulses generated based on the setting and resetting of the SR flip-flop 160, and produces one long low measurable pulse. The long measurable pulse is generated by a two-step process within the pseudo clock divider 180. The two-step process involves dividing down the pulse train frequency. That is, the transitions in the input pulse train signal 170 are divided in half. The pulse width itself after this is done is a function of the cycle time and low pulse width of the input.

Figure 2:
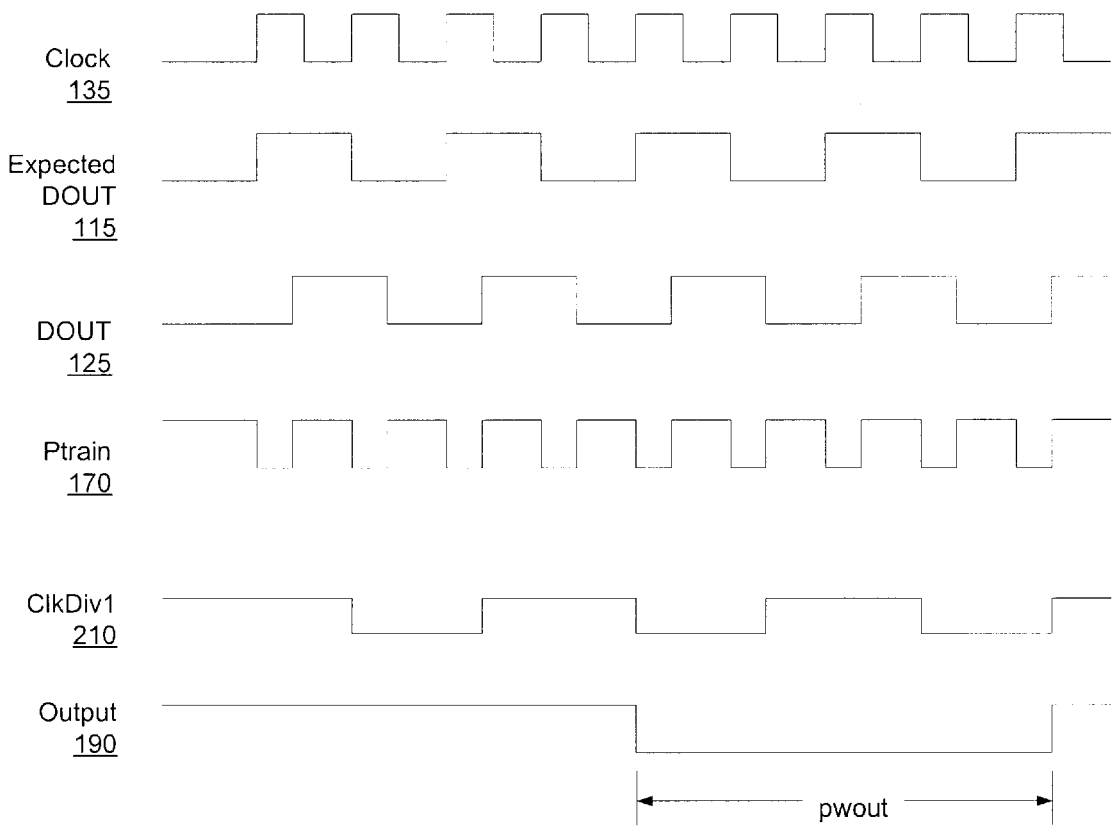
FIG. 2 is a depiction of the waveforms associated with circuit diagram illustrated in FIG. 1.

FIG. 2 illustrates the waveforms associated with the two step process of the pseudo clock divider 180. As shown in FIG. 2, the pulse train signal 170 is low during the time it takes to access the memory element 150 and is high for the rest of the cycle. The clock division 1 signal "ClkDiv1" 210 starts high and then falls on the second falling edge of the input pulse train 170. After the clock division 1 signal 210 falls, it rises again on the second rising edge of the input pulse train signal 170, and so on.

The output signal 190 from the pseudo clock divider 180 operates in a similar manner with regard to the input being the clock division 1 signal 210. That is, on the second falling edge of the clock division 1 signal 210, the output signal 190 falls. Thereafter, on the second rising edge of the clock division 1 signal 210, the output signal 190 rises again.

The resulting output pulse width of the output signal 190 is referred to as pwout. The pulse width pwout is five times the memory access time plus 4 times the cycle time minus the access time. In equation form, this looks like:

$$5*tacc+4*(tcycle-tacc) \quad (1)$$

The value of 5*tacc represents the portions of the pulse train 170 that are low within pwout. One can see from FIG. 2 that there are five "valleys" or low periods in the pulse train 170 within the range denoted pwout. The value of 4*(tcycle−tacc) represents the portions of the pulse train 170 that are high within pwout. One can see from FIG. 2 that there are four "hills" or high periods in the pulse train 170 within the range denoted pwout. Thus, the pulse width pwout is combination of the "hills" and "valleys."

Equation 1 reduces down to:

$$tacc+4tcycle \quad (2)$$

where tacc is the last memory access time. This gives a cycle time independent way to measure the access time on an output pad as long as the cycle time is consistent. That is, when measuring the output signal on the output pad, a simple calculation of subtracting 4tcycle from the pulse width measured at the output pad will result in the memory access time. In this way, an operation characteristic of the memory element 150 is measured using an on-chip apparatus and a single testing channel. In this way, error is reduced such that a better validation of simulation data may be performed based on measured operational characteristics of the actual circuit element.

Thus, the present invention provides a mechanism by which long measurable pulse widths are produced on a single output pad. With this invention, a pulse width of 10 s of ns is possible as opposed to only 1–2 ns with prior art apparatus and methodology. In addition, with the present invention, the pulse width measurement may be done with a single tester channel, i.e. one channel for the output pad, rather than two as is required in the prior art, and thus, the error in the measurement is appreciably reduced.

The same methodology outlined above can be used to obtain operational characteristic information about other types of circuit components and other operation characteristics of memory circuit components as well. For example, the same methodology described above may be used to determine memory write through timing during a write. Due to the small and simple nature of the comparators and the entire circuit, the apparatus of the present invention may be laid out as a small hard macro, i.e. the present invention may be laid out in a new "cell" and placed with all its elements together, to reduce any effects of mismatched signal routing.

In a further embodiment, the apparatus of the present invention may be coupled with an on-chip speed test circuit. With this embodiment, an on-chip state machine may be provided that exercises the memory element 150 at an increased frequency and also drives the expected data output signal input for the present invention. This on-chip state machine may have a register stack of address and corresponding data words that may be written and/or read from the memory element 150. The state machine may be driven at a high frequency from a PLL or other high frequency clock generator. As an example of a read test, the state machine would write test data to the memory slowly and follow the write with nine "at speed" reads from the memory to generate the pulse train with the present invention. By so doing, the effects of reduced cycle time on the access time of the memory element 160 may be measured.

The description of the preferred embodiment of the present invention has been presented for purposes of illustration and description, but is not limited to be exhaustive or limited to the invention in the form disclosed. Many modifications and variations will be apparent to those of ordinary skill in the art. For example, rather than using only two passes of the algorithm within the pseudo clock divider to generate an output signal, the present invention may use three or more passes of the algorithm. Moreover, any type of source for driving the expected data output signal and/or the memory element inputs may be used without departing from the spirit and scope of the present invention.

The embodiment was chosen and described in order to best explain the principles of the invention the practical application to enable others of ordinary skill in the art to understand the invention for various embodiments with various modifications as are suited to the particular use contemplated.

What is claimed is:

1. An apparatus for measuring a signal skew between two on-chip signals, comprising:
   first means for identifying a transmission of a first signal;
   second means for identifying a transmission of a second signal; and
   third means for generating a pulse train based on the identification of the transmission of the first signal and the transmission of the second signal, wherein the pulse train represents a signal skew the first signal and the second signal, wherein the means for identifying a transmission of the first signal includes a first comparator having a clock signal and a reference voltage as inputs and generating a first output signal based on a comparison of the clock signal with the reference voltage, the means for identifying the transmission of the second signal includes a second comparator having a reference output signal and an output signal from a circuit component as inputs and generating a second output signal based on a comparison of the reference output signal with the output signal from the circuit component, and wherein the third means generates the pulse train based on the first output signal and the second output signal.

2. The apparatus of claim 1, wherein the first signal is the clock signal being transmitted to the circuit component.

3. The apparatus of claim 2, wherein the second signal is the output signal transmitted from the circuit component.

4. The apparatus of claim 3, wherein the means for generating a pulse train includes a flip-flop, wherein a "set" input of the flip-flop is an output from the second means, and wherein a "reset" input of the flip-flop is an output from the first means.

5. The apparatus of claim 1, wherein the third means for generating a pulse train includes an SR flip-flop, wherein the state of the SR flip-flop is set or reset based on the identification of the transmission of the first signal and the transmission of the second signal.

6. The apparatus of claim 1, wherein the first means, second means and third means are on an integrated circuit chip associated with the first signal and the second signal.

7. The apparatus of claim 1, wherein at least one of the first means, second means and third is on an integrated circuit chip associated with the first signal and the second signal.

8. The apparatus of claim 1, further comprising:
   a clock divider means that receives the pulse train as an input and generates a clock divided pulse train as an output.

9. The apparatus of claim 8, wherein the clock divider generates a first output signal that starts high and falls on a second falling edge of the pulse train.

10. The apparatus of claim 9, wherein the clock divider generates a second output signal that falls on a second falling edge of the fist output signal and rises on a second rising edge of the first output signal.

11. The apparatus of claim 1, wherein the first signal is a clock signal sent to a memory element, and wherein the second signal is an output from the memory element.

12. An apparatus for measuring a signal skew between two on-chip signals, comprising:
   first means for identifying a transmission of a first signal;
   second means for identifying a transmission of a second signal;
   third means for generating a pulse train based on the identification of the transmission of the first signal and the transmission of the second signal, wherein the pulse train represents a signal skew between the first signal and the second signal; and
   a clock divider means that receives the pulse train as an input and generates a clock divided pulse train as an output, wherein the clock divided pulse train has a pulse width equal to a function of the skew between the first signal and the second signal.

13. The apparatus of claim 12, wherein the first signal is a clock signal sent to a memory element, and wherein the second signal is an output from the memory element.

14. The apparatus of claim 13, wherein the pulse width is a function of at lease one of a memory access time and a cycle time.

15. The apparatus of claim 14, wherein the pulse width is tacc+4*tcycle, wherein tacc is a last memory access time and tcycle is a cycle time.

16. The apparatus of claim 13, wherein the pulse width represents a delay in the memory element.

17. The apparatus of claim 13, wherein the pulse train is low during a memory access time and high at other times during a cycle.

18. An apparatus for determining a memory access time for an on-chip memory element, comprising:
   a first comparator for identifying a clocking of the memory element;
   a second comparator for identifying an output from the memory element; and
   a flip-flop for generating a pulse train based on a setting and resetting of the flip-flop in response to receiving a set input from the second comparator and a reset input from the first comparator, wherein the memory access time is a function of a pulse width and cycle time of the pulse train.

19. A method for measuring a signal skew between two on-chip signals, comprising:
   identifying a transmission of a first signal;
   identifying a transmission of a second signal; and
   generating a pulse train based on the identification of the transmission of the first signal and the transmission of the second signal, wherein the pulse train represents a signal skew between the first signal and the second signal, wherein identifying a transmission of the first signal includes comparing a clock signal with a reference voltage and generating a first output signal based on the comparison of the clock signal with the reference voltage, identifying the transmission of the second signal includes comparing a reference output signal and an output signal from a circuit component and generating a second output signal based on the comparison of the reference output signal with the output signal from the circuit component, and wherein the pulse train is generated based on the first output signal and the second output signal.

20. The method of claim 19, wherein the first signal is a clock signal being transmitted to the circuit component.

21. The method of claim 20, wherein the second signal is the output signal transmitted from the circuit component.

22. The method of claim 21, wherein generating a pulse train includes using a flip-flop to generated the pulse train, wherein a "set" input of the flip-flop is an output from the second means, and wherein a "reset" input of the flip-flop is an output from the first means.

23. The method of claim 19, wherein generating a pulse train includes setting or resetting a state of a SR flip-flop based on the identification of the transmission of the first signal and the transmission of the second signal.

24. The method of claim 19, wherein the steps of identifying and generating are performed by on-chip elements of an integrated circuit chip associated with the first signal and the second signal.

25. The method of claim 19, wherein at least one of the steps of identifying a transmission of a first signal, identifying a transmission of a second signal, and generating a pulse train is performed by an on-chip element of an integrated circuit chip associated with the first signal and the second signal.

26. The method of claim 19, further comprising generating a clock divided pulse train as an output based on the pulse train.

27. The method of claim 26, wherein generating a clock divided pulse train as an output based on the pulse train includes generating a first output signal that stands high and falls on a second falling edge of the pulse train.

28. The method of the claim 27, wherein generating a clock divided pulse train as an output based on the pulse train further includes generating a second output signal that falls on a second falling edge of the first output signal and rises on a second rising edge of the first output signal.

29. The method of claim 19, wherein the first signal is a clock signal sent to a memory element, and wherein the second signal is an output from the memory element.

30. A method for measuring a signal skew between two on-chip signals, comprising:

identifying a transmission of a first signal;

identifying a transmission of a second signal;

generating a pulse train based on the identification of the transmission of the first signal and the transmission of the second signal, wherein the pulse train represents a signal skew between the first signal and the second signal; and generating a clock divided pulse train as an output based on the pulse train, wherein the clock divided pulse train has a pulse width equal to a function of the skew between the first signal and the second signal.

31. The method of claim 19, wherein the first signal is a clock signal sent to a memory element, and wherein the second signal is an output from the memory element.

32. The method of claim 31, wherein the pulse width is a function of at least one of a memory access time and cycle time.

33. The method of claim 32, wherein the pulse width is tacc+4*tcycle, wherein tacc is a last memory access time and tcycle is a cycle time.

34. The method of claim 31, wherein the pulse width represents a delay in the memory element.

35. The method of claim 31, wherein the pulse train is low during a memory access time and high at other times during a cycle.

* * * * *